United States Patent [19]
Goto et al.

[11] Patent Number: 5,569,569
[45] Date of Patent: Oct. 29, 1996

[54] STENCIL MASK

[75] Inventors: Takashi Goto, Ushiku; Shingo Terakado, Tsukuba, both of Japan

[73] Assignee: Sanyo Electric Co., Ltd., Osaka, Japan

[21] Appl. No.: 377,306

[22] Filed: Jan. 24, 1995

[30]     Foreign Application Priority Data

Jan. 25, 1994 [JP] Japan .................................. 6-006267

[51] Int. Cl.$^6$ ........................................................ G03F 9/00
[52] U.S. Cl. .............................. 430/5; 430/308; 430/313; 430/314; 430/315; 219/69.17; 219/69.2; 216/51
[58] Field of Search ................................ 430/5, 308, 313, 430/314, 315, 323, 324; 219/69.17, 69.2; 156/644, 657, 662

[56]                References Cited

U.S. PATENT DOCUMENTS 5,401,932  3/1995  Hashimoto et al. ........................ 430/5

OTHER PUBLICATIONS

N. Atoda, et al., "Diffraction effects on pattern replication with snychrotron radiation", J. Vac. Sci. Technol. B1 (4), Oct.–Dec. 1983, pp. 1267–1270.

Semicon News, VLSI Process, Jan. 1988.: pp. 31–38.

Masataka Hirose, "Plasma and Photo–excited Processes", Oct. 9, 1984, pp. 45–54/.

Primary Examiner—S. Rosasco
Attorney, Agent, or Firm—Loeb & Loeb LLP

[57]                ABSTRACT

A stencil mask for use in a photochemical reaction process includes a path extending between the rear and front surfaces thereof. The path is used with a window for passing photons so as to supply a reactive medium and discharge an exhaust medium containing reaction products. Further, the path also serves as a space for separating an object from a pattern on a mask substrate. The path has a depth which is smaller than a minimum value attained by a semiconductor manufacturing process.

28 Claims, 10 Drawing Sheets

PRIOR ART

STENCIL MASK

BACKGROUND OF THE INVENTION

1. Field of the Invention

This invention relates to a stencil mask for use with a photochemical reaction process, and more particularly to a stencil mask to be in intimate contact with an object to be processed.

2. Description of the Prior Art

At present, a plasma-assisted reactive-ion etching (RIE) method has been in wide use to manufacture semiconductor devices. However, the more the semiconductor devices are integrated and miniaturized, the more extensively the operation of components thereon is affected by damage caused during the manufacturing process. The lower the acceleration ion energy, the less the semiconductor components are damaged during RIE. On the other hand, reduction in the ion energy lowers the etching anisotrophy, which makes it difficult to depict minute precise patterns. Such a phenomenon is reported in "Semiconductor News", page 31, October, 1988.

The use of the photochemical reaction process without using charged particles, referred to in HYOMEN KAGAKU, Vol. 5, No. 4, page 435, has drawn our attention with its application to the manufacture of semiconductors. No intimate contact type etching mask (i.e. photoresist mask) is necessary in the photochemical reaction process although such a mask is indispensable in the RIE process. In other words, the surface of a semiconductor substrate can be directly processed.

In the photochemical reaction process, a semiconductor substrate to be processed is placed in a reaction chamber, and is selectively etched at its certain areas. Photons and a reactive gas such as a fluoride-based gas are used for this process.

Figure 8:
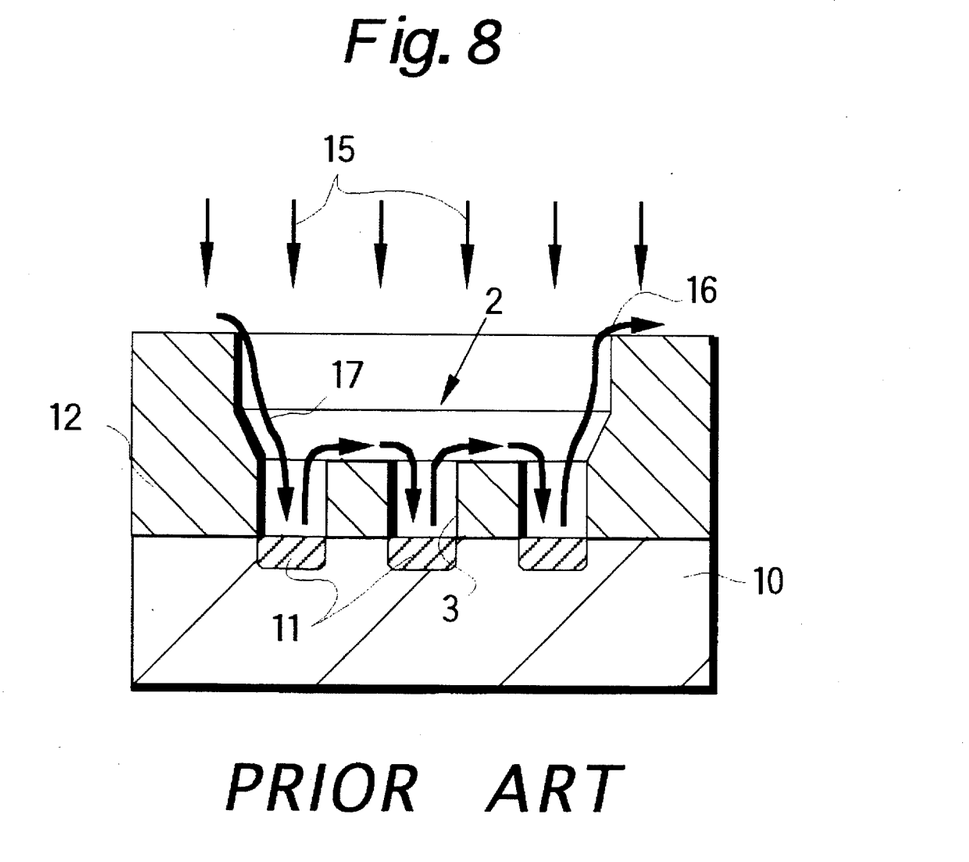
FIG. 8 is a cross-sectional view showing an etched state of a stencil mask of the prior art.

FIG. 8 of the accompanying drawings shows a basic structure of the stencil mask of the prior art, and shows how the semiconductor substrate is etched.

Referring to FIG. 8, the stencil mask 12 is in intimate contact with the surface of the semiconductor substrate 10 (i.e. an object to be processed, referred to as "an object"). A window 2 and a pattern 3 are formed on the stencil mask 12. Photons 15 are radiated onto areas 11 to be processed on the semiconductor substrate i.e. photon radiating areas, or reaction areas) via the window 2 and the pattern 3. The photons 15 excites either the reactive gas 17 or the surface of the semiconductor substrate 1, or both of them. The reactive gas 17 is supplied to the areas 11 via the window 2 and the pattern 3, and etches the surface of the semiconductor substrate 1. An exhaust gas 16 is produced at the area 11, and is discharged out of the stencil mask 12 via the pattern 3 and the window 2.

The foregoing stencil mask 12 is prone to the following problems.

(1) Both the window 2 and the pattern 3 are used not only to supply the reactive gas 17 but also to discharge the exhaust gas 16. In other words, the window 2 has to pass the exhaust gas 16 as well as the photons 15. Further, the window 2 has to transfer the photons 15 and the exhaust gas 16 in opposite directions. Therefore, the window 2 tends to reduce its capability to pass the photons 15 and the exhaust gas 16, which means that the etching capability will be lowered.

(2) The exhaust gas 16 contains various reaction products generated by the photochemical reaction process. When the exhaust gas 16 is discharged externally via the pattern 3 and the window 3 of the stencil mask 12, such reaction products are discharged externally via the pattern 3 and the window 2, but some of them remain deposited on the pattern 3 and the window 2. The pattern 3 (i.e. shape of the mask) would be deformed by the deposited products, thereby preventing depiction of an accurate pattern on the semiconductor substrate 1. Furthers the deposited products may deform the paths for passing the reactive gas 17 and the exhaust gas 16, which would further reduce the capability of processing the semiconductor substrate.

(3) The reaction products contained in the exhaust gas 16 tend to re-stick onto the surface of the areas 11 to be processed. It is therefore necessary to etch such sticking products, so that the etching speed (etching capability) will be lowered.

To overcome the foregoing problem, the inventors tried to interpose a spacer so as to form an appropriate space between the front surface of the semiconductor substrate 10 and the stencil mask. Such a spacer was for defining a path passing the reactive gas 17 and the exhaust gas although such a process has not been publicly known yet. The spacer should have been very thin, and was made of aluminum foil. Unfortunately, however, this process has the following problems.

1) The aluminum foil as the spacer has a thickness in the range 5 μm to 50 μm, which is several ten to several hundred times larger than the thickness of sub-microns or quarter-microns to be processed in the microfabrications of semiconductor devices. Therefore, the photons 15 stopped by the pattern 3 are extensively diffracted by the spacer, so that the diffracted photons adversely affect the processing accuracy.

2) It is extremely difficult to precisely position the stencil mask 12 on the semiconductor substrate 10 since the aluminum spacer is present between them. Thus, the surface of the semiconductor substrate if cannot be processed accurately. In addition to positioning the stencil mask 12 on the semiconductor substrate 10, the aluminum spacer should be carefully placed on the semiconductor substrate 10. This means that the processing work cannot be performed effectively.

3) The aluminum spacer is prone to wrinkles and breakage. Such wrinkles may cause variable spaces between the surface of the semiconductor substrate 10 and the stencil mask 12, which would lead to non-uniform diffraction or non-uniform distribution of the photons on the surface of the semiconductor substrate 10. This phenomenon would also lower the processing accuracy.

SUMMARY OF THE INVENTION

The present invention is contemplated so as to overcome the foregoing problems of the prior art.

It is a first object of the invention to provide a stencil mask which is usable for the photochemical reaction process to process a semiconductor substrate effectively and accurately.

It is a second object of the invention to provide a stencil mask which is easy to position on the semiconductor substrate.

According to a first aspect of the invention, a stencil mask includes a path formed on an absorber film. The path is used to supply a reactive medium and discharge an exhaust medium containing reaction products, and communicates with a pattern on the absorber film and a rear or side surface of a mask substrate. The path has a plurality of portions extending between the pattern and the rear surface of the mask substrate.

The stencil mask has the following advantages.

(1) The reactive medium and the exhaust medium are mainly supplied and discharged via the path which is separate from the pattern and the window. It is possible to increase an amount of reactive gas to be supplied and an amount of exhaust gas to be discharged, which improves the etching efficiency.

(2) The reaction products caused by the photochemical reaction process are also discharged via the path together with the exhaust gas, so that only a reduced amount of the exhaust gas passes through the pattern and the window, and deposits around the pattern. Thus, the pattern is substantially free from deformations caused by such reaction products, which can maintain the original quality of the pattern.

(3) Even if the reaction products re-stick onto the surface of the object areas, they can be removed by the reactive medium supplied via the path and can be discharged with the exhaust gas. Thus, it is possible to accelerate the etching operation.

In a second aspect of the invention, a stencil mask includes a thin film, which is formed using a deposition or an epitaxial process on the front surface of the absorber film, at a region where the pattern and the side surface of the mask substrate communicate with each other. The region where the pattern and the side surface of the mask substrate communicate with each other is removed by etching. Thus, a path is defined by the absorber film and the thin film so as to pass the reactive medium and exhaust gas containing reaction products. The thin film has a thickness smaller than sub-microns. The region where the pattern and the side surface of the mask substrate communicate with each other is removed by etching.

The stencil mask according to the second aspect is advantageous in the following.

(1) The absorber film is deposited or formed by an epitaxial process on the thin film, or the absorber film is etched so as to form the path. The path has a depth, and separates the pattern from the object when the stencil mask is in intimate contact with the object. Therefore, no aluminum spacer is necessary. The depth of the path can be smaller than the minimum thickness which can be attained by the semiconductor manufacturing technique, and can remain uniform and unchangeable. In other words, the presence of this minute space can reduce unnecessary diffraction of the photons between the object and the pattern. This assures the precise pattern. Further, the uniform depth of the path is effective to assure uniform radiation intensity of the photons in the respective photochemical reaction processes, which means that the pattern can be more uniformly depicted.

(2) The space for separating the object and the pattern is secured on the stencil mask itself and no aluminum spacer is necessary. Thus, the object and the stencil mask are accurately matched by only one positioning operation. This means that the object can be processed accurately and efficiently.

BRIEF DESCRIPTION OF THE DRAWINGS

FIG. 2A to FIG. 2H are cross-sectional views showing progressive steps in a first stencil mask making process.

FIG. 3A to FIG. 3D are cross-sectional views showing progressive steps in a second stencil mask making process.

FIG. 4A to FIG. 4E are cross-sectional views showing progressive steps in a third stencil mask making process.

FIG. 5A to FIG. 5D are top views showing modifications of a stencil mask according to a second embodiment of the invention.

DESCRIPTION OF THE PREFERRED EMBODIMENTS

Embodiment 1:

A basic structure of a stencil mask 1 according to a first embodiment of the invention will be described by referring to FIGS. 1A to 1C. In the cross-sectional views, the lines on the mask pattern are omitted to simplify the drawings and promote easy understanding of the invention. The stencil mask 1 comprises a mask substrate 4, intermediate films 5, 5S, an absorber film (functional support film) 6, a rear reinforcement film 6S, a pattern 3, a window 2, and a path 7 for supplying a reactive gas and discharging an exhaust gas.

The mask substrate 4 is made of single crystal silicon (Si), and serves as a host for the stencil mask 1. The silicon has been extensively used for semiconductor devices because of its reliability, easy processing, and a reduced cost. Further the technique to process a silicon substrate has been substantially completed. In addition to the silicon, materials such as $SiO_2$, MgO and ITO (indium tin oxide) are used as the mask substrate.

Further, the mask substrate 4 may be made of materials such as GaAs, InP, Al, $Al_2O_3$, or Cu. Compared to the silicon, these material are resistant to the etching with a fluoride-based gas, abrasion by the laser beams, and impairment by the photochemical reaction process. The use of these materials allows the stencil mask to have a longer effective life and to be used repeatedly.

Still further, materials such as Ni, NiO, FeO, $Fe_2O_3$, $Fe_3O_4$, Cr, CrO, $Cr_2O_3$, or a nickel (Ni) alloy (for instance, SUS324 or SUS304: trade names) may be used as the stencil mask 4. These material are also resistant to the etching with a halogen-based gas, abrasion by the laser beams, and impairment by the photochemical reaction process compared to the silicon.

Materials which are susceptible to the photochemical reaction process may be used as the stencil mask so long as the precision of the pattern 3 and the strength of the stencil mask are in acceptable ranges.

The absorber film 6 is overlaid on the mask substrate 4 via the intermediate film 5, and not only absorbs but also reflects photons. The absorber film 6 is made of gold (Au). Further, the absorber film 6 may be made of materials such as metals, alloys, metal carbide, metal nitride, metal oxide, metal boronide, metal silicide, materials for semiconductors, and organic materials.

The metals are tantalum (Ta), tungsten (W), rhenium (Re), platinum (Pt), molybdenum (Mo), titanium (Ti), and aluminum (Al).

The alloys are tungsten-rhenium (W-Re), and platinum-palladium (Pt-Pd).

The metal carbide materials are AuC, TaC, WC, $W_2C$ and TiC.

The metal nitride materials are TaN, $Ta_3N_5$, WN and TiN.

The metal oxide materials are $Ta_2O_5$, $WO_3$, $ReO_2$, $TiO_2$, $MoO_2$ and $Al_2O_3$.

The metal boronide materials are $TAB_4$, WB, $W_2B$, and TiB.

The metal silicide materials are $WSi_2$ and $TiSi_2$.

The materials for semiconductors are Si, SiC, $Si_3N_4$, SiN, $SiO_2$, C, BN, BNC, GaAs and InP.

The organic material is polyimid resin.

The absorber film 6 is made of a film which is resistant to corrosion caused by a reactive gas such as a fluoride-based gas or a halogen-based gas, abrasion due to laser beams, and damages caused during the photochemical reaction process. When the absorber film 6 is made of any of the foregoing materials, the stencil mask can have a longer effective life and can be used repeatedly. Especially, the heavy metals such as Au and W tend to absorb vacuum ultraviolet rays having an approximately 100 Å wavelength, so that the absorber film 6 made of the heavy metal film can be thinner. Further, film materials which are affected by the photochemical reaction process may also be used so long as the precision of the pattern 3 and the mechanical strength of the stencil mask are within acceptable ranges.

The intermediate film 5 serves to enhance an adhering force (close contact) between the mask substrate 4 and the absorber film 6. The intermediate film 5 is made of a material such as a chromium (Cr) film, and may be made of Ni, Ti, In, $InO_2$, $Al_2O_2$, or epoxy resin. In other words, the intermediate film 5 is resistant to corrosion caused by a reactive gas such as a fluoride-based gas or a halogen-based gas, abrasion due to laser beams, and damage caused during the photochemical reaction process. Therefore, the stencil mask can lengthen its effective life and can be used repeatedly. The materials which are affected by the photochemical reaction process may be also used so long as the precision of the pattern 3 and the mechanical strength of the stencil mask are within acceptable ranges. Further, when the absorber film 6 and the mask substrate 4 have sufficient adhering force therebetween, the intermediate film 5 is not always necessary. If the intermediate film 5 is made of a material enabling it to function as the absorber film 6, the mask substrate 4 has a single layer of the intermediate film 5.

The pattern 3 is depicted on the absorber film 6 and the intermediate film 5 at the center of the mask substrate 4, i.e. a region corresponding to the window 2. A final pattern to be transferred onto the object (i.e. semiconductor substrate) is depicted on the absorber film 6. The pattern 3 includes perforated areas and non-perforated areas of the absorber film 6. The non-perforated areas shield the photons while the perforated areas communicate with the window 2.

The rear reinforcement film 6S is overlaid on the rear surface of the mask substrate 4 via the other intermediate film 5S. The rear reinforcement film 6S prevents the mask substrate 4 from being bent (i.e. reinforces the mask substrate 4 mechanically). When the mask substrate 4 has a sufficient mechanical strength, the rear reinforcement film 6S is dispensable. In this embodiment, the rear reinforcement film 6S is similar to the absorber film 6 in the material and thickness.

The intermediate film 5S serves to enhance an adhering force between the mask substrate 4 and the rear reinforcement film 6S. However, the rear reinforcement film 6S is dispensable if the intermediate film 5S can reinforce the mask substrate 4 mechanically.

The window 2 is formed substantially at the centers of the rear reinforcement film 6S, intermediate film 5S and mask substrate 4. As described above, the window 2 communicates with the perforated portions of the pattern 3 so as to pass the photons to the pattern 3.

Figure 1A:
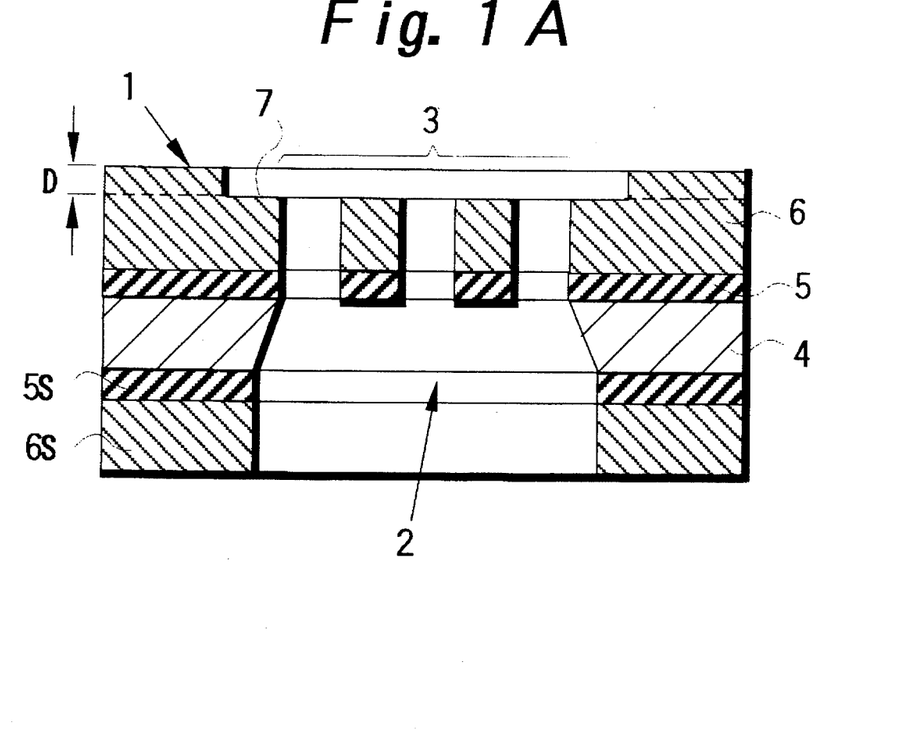
FIG. 1A is a cross-sectional view, taken along line 1A—1A of FIG. 1C, of a stencil mask for a photochemical reaction process, according to a first embodiment of the invention.
Figure 1B:
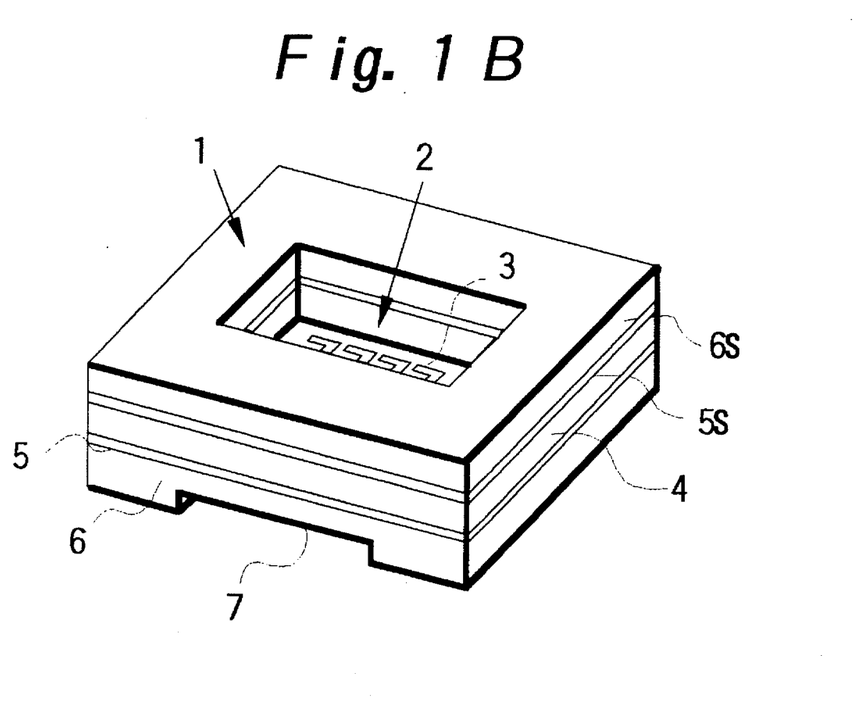
FIG. 1B is a perspective view of the stencil mask of FIG. 1A.
Figure 1C:
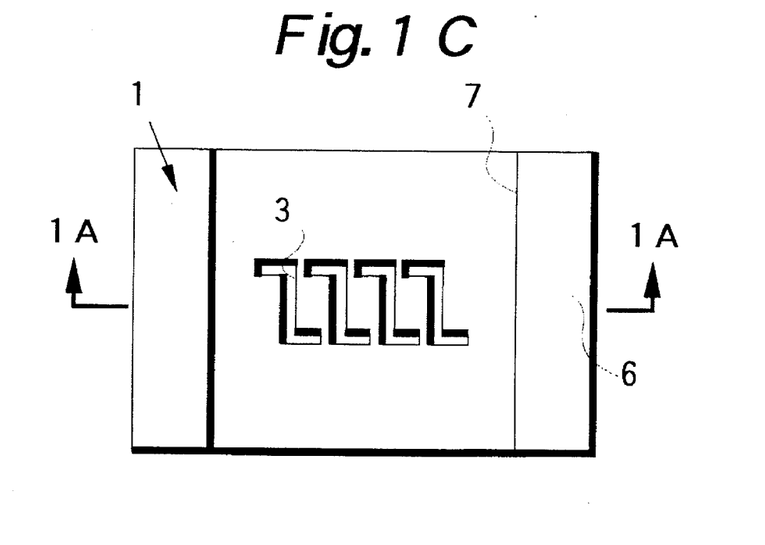
FIG. 1C is a top view of the stencil mask of FIG. 1A.

Referring to FIGS. 1A and 1B, the path 7 is defined on the absorber film 6 at the center thereof (i.e. on the pattern 3), and has a depth D. The depth D can be set to a value which is smaller than a minimum dimension attained by the semiconductor manufacturing technique. The depth D can be maintained uniform, i.e. approximately several hundred nanometers. Thus, the path 7 not only supplies the reactive gas and discharges the exhaust gas but also minimizes a distance between the pattern 3 and the surface of the object 10 to be processed, thereby extensively reducing the diffraction of the photons.

Figure 1D:
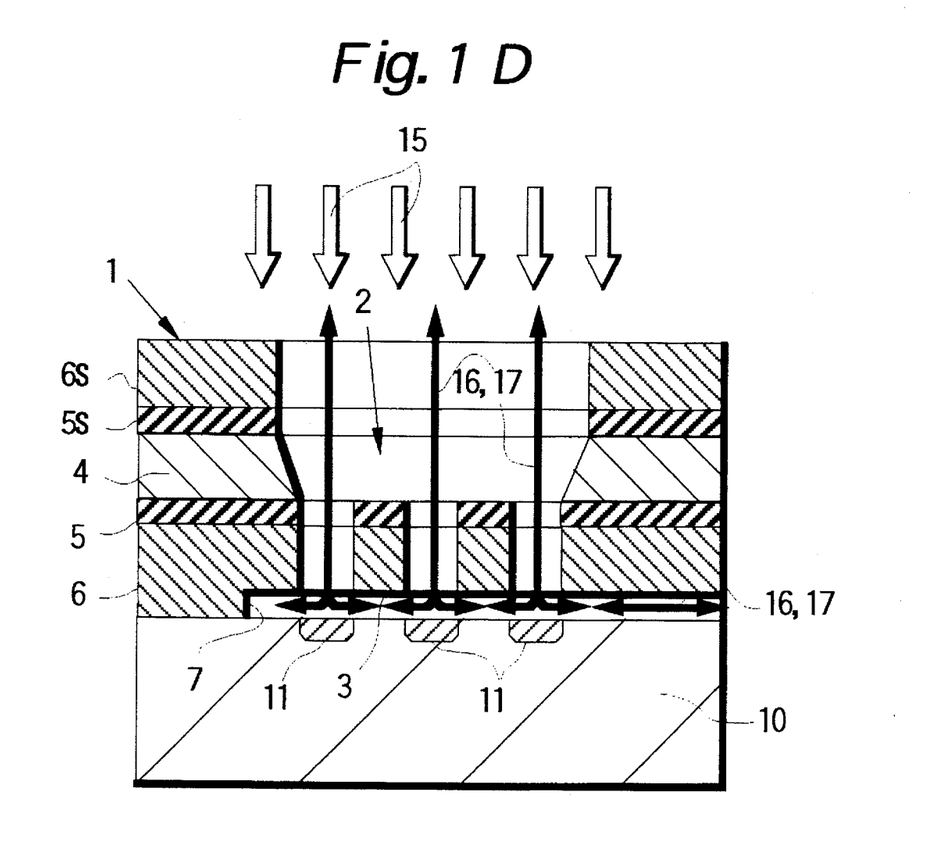
FIG. 1D is a cross-sectional view showing a state in which the stencil mask is used in the photochemical reaction process.

FIG. 1D specifically shows how the stencil mask 1 is used in the photochemical reaction process.

As shown in FIG. 1D, the stencil mask 1 is intimately overlaid on the surface of the object 10. The object 10 is covered, except for the path 7, by the absorber film 6 of the stencil mask 1. The object 10 is a single crystal silicon (Si) substrate, for example, on which semiconductor elements, metal interconnects, etc. are disposed.

The photons 15 are irradiated onto the object 10 via the window 2 and the pattern 3. The photons 15 excite either the reactive gas 17 or the object 10, or both of them, thereby assisting the surface of the object 10 to be etched. In FIG. 1D, reference numeral 11 represents etched areas of the object 10.

A fluoride-based gas is used as the reactive gas 17. The reactive gas 17 is supplied to the areas 11 to be etched on the object 10 via the window 2 and the path 7. The exhaust gas 16 generated after the etching process and containing reaction products is discharged outside the stencil mask 1 via the pattern 3, the window 2 and the path 7.

Methods of making stencil masks will be described hereinafter.

First stencil mask method:

Referring to FIG. 2A to FIG. 2H, this method comprises forming the absorber film 6, the pattern 3 and the path 7 by the lift-off process, and making the window 2 by the back etching.

Figure 2:
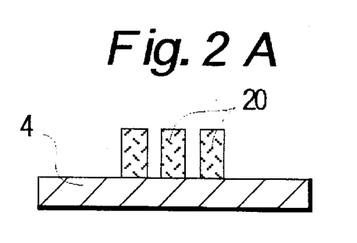

In a first step, a mask 20 is formed on the mask substrate 4 at the center thereof. A single crystal silicon (Si) substrate (a semiconductor wafer) 400 μm to 600 μm thick is used as the mask substrate 4. The mask 20 may be an electron beam resist, e.g. MICROPOSIT E-BEAM RESIST SAL601-ER7 (trade name), manufactured by SHIPLEY. The mask 20 is formed on the mask substrate 4 to a thickness of 600 nm using focussed ion beams (FIB). The mask 20 is developed by a developer such as MICROPOSIT Developer MF622 (trade name), manufactured by SHIPLEY. Further, the mask 20 may be exposed by electron beams, X-ray beams, laser beams, or the like.

When the FIB process is applied the mask 20 can be patterned with lines and spaces whose size is in the order of sub-microns.

In a second step, an intermediate film 5 and an absorber film 61 (a first overlay) are sequentially overlaid on the mask substrate 4 and the mask 20 as shown in FIG. 2B.

The intermediate film 5 is a chromium (Cr) film which is made by the vacuum evaporation process. A vacuum evaporation rate is set to 0.2 nm/s, for example. The Cr film is 30 nm thick. The absorber film 61 is an Au film, for example, which is vacuum-evaporated at a rate of 1.2 nm/sec. The Au absorber film 61 is 300 nm to 450 nm thick.

The absorber film 61 may be a tungsten (W) film. It is preferable that an appropriate material is selected for the absorber film 61 depending upon a wavelength of photons used for the photochemical reaction process.

Referring to FIG. 2C showing a third step, the lift-off technique is applied. The mask 20 is removed, and unnecessary regions of the intermediate film 5 and the absorber film 61 are also removed, so that the pattern 3 is formed on the absorber film 61. The mask 20 is removed by a mixture of sulfide acid ($H_2SO_4$) and hydrogen peroxide ($H_2O_2$), for example, and ultrasonic waves.

In a fourth step shown in FIG. 2D, a mask 21 is formed, by the FIB process, on a region which ranges over the pattern 3 and the absorber film 61, i.e. near the center of the mask substrate 4. Alternatively, the mask 21 may be formed by the ordinary photoligthographic process, since it is not required that the mask 21 should be precisely positioned.

Referring to FIG. 2E showing a fifth step, a thin absorber film (a second overlay) 62 is deposited on the absorber film 61 and the mask 21. The absorber film 62 is an Au film which is deposited by the vacuum evaporation process under the condition mentioned above. A path having a depth D is defined by the absorber films 61 and 62. This path is positioned at the center of the absorber film 61 (i.e. on the surface of the pattern 3), and serves to pass a reactive gas and an exhaust gas. Further, the absorber film 62 is as thin as possible so as to maintain a minute gap between the object 10 and the pattern 3. In this embodiment, the absorber film 62 is thinner than a minimum thickness which can be attained by the semiconductor manufacturing technique, i.e. approximately 100 nm to 200 nm thick. In the semiconductor manufacturing process, the deposited thickness of the absorber film 62 can be easily controlled in the order of sub-microns so as to be uniform. In other words, the depth D of the path 7 can be controlled precisely and easily.

The absorber film 62 may be also formed by another epitaxial process such as plating. If the photons can be locally radiated onto the pattern 3, areas free from photons are not always required to be the absorber film 62. In such a case, it is possible to use another film made of a material which can be in intimate contact with the absorber film 61. Such a film may be formed by another epitaxial process similar to the deposition, e.g. sputtering, or molecular beam epitaxy.

In a sixth step shown in FIG. 2F, the lift-off technique is applied. The mask 21 is removed together with an unnecessary region of the absorber film 62. Thus, an absorber film 6 having the path 7 can be obtained. The mask 21 is removed similarly to the mask 20.

Referring to FIG. 2G showing a seventh step, an intermediate film 5S and a rear reinforcement film 6S are sequentially overlaid on the rear surface of the mask substrate 4. The intermediate film 5S and the rear reinforcement film 6S have an opening at their centers, which will function as a part of the window 2. This opening is large enough to accommodate the pattern 3 on the mask substrate 4.

Similarly to the intermediate film 5, the intermediate film 5S is a Cr film, and is approximately 30 nm thick. The rear reinforcement film 6S is similar to the rear reinforcement film 6 in the material (i.e. Au) and thicknesses in the range 300 nm to 450 nm.

The opening is made on the intermediate film 5S and the rear reinforcement film 6S by the lift-off process using FIB or photolithography, or an ordinary patterning process using an anisotropic etching technique.

As shown in FIG. 2H showing an eighth step, a through hole is made by using the opening on the rear reinforcement film 6S, and extends between the rear and front surfaces of the mask substrate 4. The through hole and the foregoing opening constitute the window 2.

The through hole is formed by back-etching. The absorber film 5S and the rear reinforcement film 6S except for the window 2 are covered by a protective wax, which protects the mask substrate 4 against the back-etching. The back-etching is performed by using an aqueous solution which contains 20 wt % potassium hydroxide, and is at a temperature of 90° C. to 100° C. The protective wax is made of a material containing tar, and is resistant to alkalized solutions. A solvent such as toluene or xylene is used to apply or remove the protective wax. Usually, it is not necessary to remove the protective wax so long as it does not affect the stencil mask. In such a case, the process to remove the protective wax can be dispensed with. However, when it is inconvenient to leave the protective wax during the use of the stencil mask, the protective wax will be removed by the foregoing solvent. A series of the foregoing steps will produce the stencil mask 1.

Second stencil mask making method:

A second method of making a stencil mask will be described with reference to FIG. 3A to FIG. 3D. This method comprises a first step of forming a rear reinforcement film 6S by etching, a second step of making an absorber film 6 and a pattern by the lift-off technique, a third step of making a path 7 by the lift-off technique, and a fourth step of making a window 2 by etching. The second method differs from the first method in that the rear reinforcement film 6 is formed at an initial stage of the stencil making process.

Figure 3A:
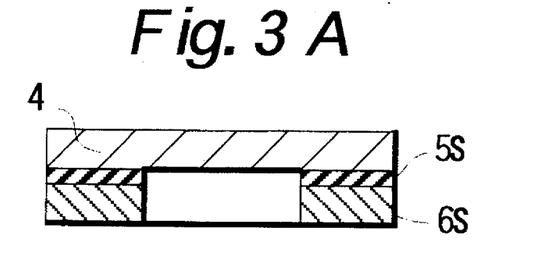

As shown in FIG. 3A showing the first step, in order to make the window 2, the intermediate film 5S and the rear reinforcement film 6S having an opening at their centers are sequentially overlaid on the rear surface of the mask substrate 4.

Figure 3B:
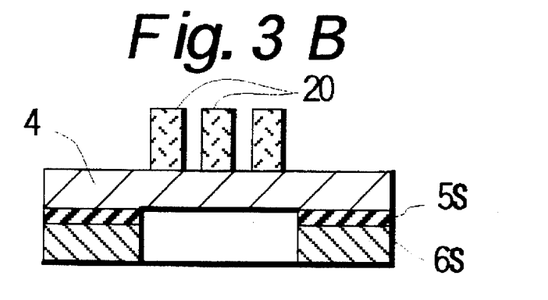

In the second step shown in FIG. 3B, the mask 20 is formed on the front surface of the mask substrate 4 so as to form the pattern 3. The intermediate film 5 and an absorber film 61, not shown, are sequentially deposited on the front surface of the mask substrate 4 and the mask 20. Then, the mask 20, and unnecessary portions of the intermediate film 5 and the absorber film 61, are removed. This process is similar to that in the first stencil making method. Thus, the intermediate film 5, the absorber film 61 and the pattern 3 are formed by the lift-off process.

Figure 3C:
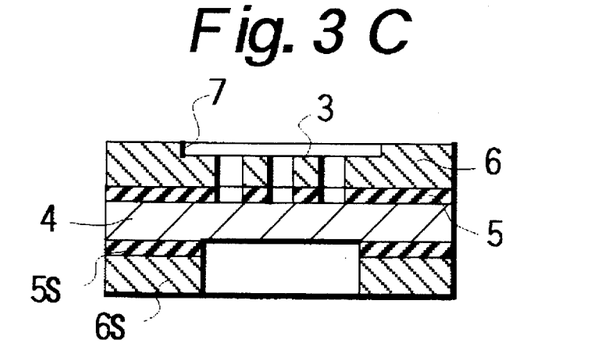

As shown in FIG. 3C showing the third step, the absorber film 62, the absorber film 6 and the path 7 are formed by the lift-off process as in the foregoing first stencil mask making process.

Figure 3D:
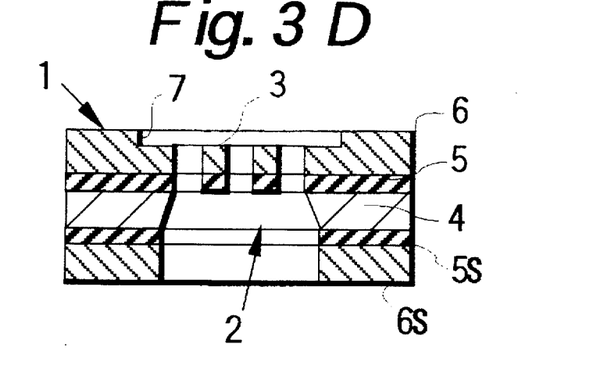

Finally, in the fourth step shown in FIG. 3D, a through hole is made on the mask substrate 4 by back-etching, thereby making the window 2. Thus, the stencil mask 1 will be produced through the foregoing steps.

Third stencil mask making methods:

Referring to FIG. 4A to FIG. 4E, the stencil mask is made as described below according to a third method. This method comprises a first step of forming the absorber film 6 and the pattern 3 on the mask substrate 4 by the etching process, a second step of making the path 7 by the etching process, and a third step of making the window by the etching process. In this method, the etching process is adopted for all of the steps in place of the lift-off technique. This method differs from the first and second method in this respect.

Figure 4:
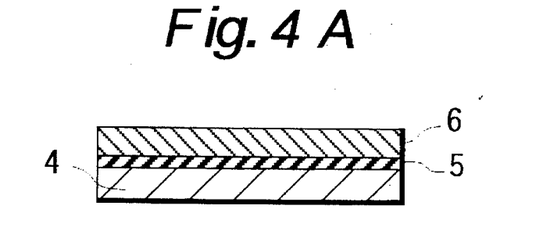

As shown in FIG. 4A showing the first step, the intermediate film 5 and the absorber 6 are sequentially overlaid on the mask substrate 4.

In the second step shown in FIG. 4B, an etching mask 22 is formed on the absorber film 6 so as to obtain the pattern 3. The etching mask 22 is an electron beam resist, which is patterned by the FIB process.

Referring to FIG. 4C showing the third step, the absorber film 6 and the intermediate film 5 are patterned by the FIB process, thereby forming the pattern 3 on the absorber film 6. In this case, the absorber film 6 is made of a highly reactive material such as tungsten (W) which is suitable to the RIE etching process. A low reactive material such as gold (Au) is not preferable for use in the RIE etching process. Thereafter, the etching mask 22 will be removed.

As shown in FIG. 4D, an etching mask 23 will be formed, and has an opening at a region where the pattern 3 and the absorber film 6 communicate each other, i.e. where the path 7 will be made. The etching mask 23 is a photoresist film, which is patterned by the photolithography.

In the final step shown in FIG. 4E, a part of the absorber film 6 is etched, by the anisotropical etching process such as the RIE process, at the region within the opening of the etching mask 23. The depth D of the path 7 is regulated by controlling an extent to etch the absorber film 6. In this embodiment, the depth D is set to a minute value of approximately several hundred nanometers. After forming the path 7, the etching mask 23 will be removed.

The steps shown in FIGS. 2G and 2H related to the first making method will be carried out thereafter. In other words, the intermediate film 5S and the rear reinforcement film 6S will be sequentially formed on the rear surface of the stencil mask 4. These films 5S and 6S will be patterned by the FIB and RIE processes, thereby making the window 2 (as shown in FIG. 2H).

A series of the foregoing steps will produce the stencil mask 1.

In the first embodiment of the invention, the stencil masks 1 are advantageous in the following.

(1) The reactive medium (i.e. the reactive gas 17) and the exhaust medium (i.e. the exhaust gas 16) are mainly supplied and discharged via the path 7 which is separate from the pattern 3 and the window 2. It is possible to increase an amount of the reactive gas 17 to be supplied and an amount of the exhaust gas 16 to be discharged, which improves the etching efficiency.

(2) The reaction products caused by the photochemical reaction process are also discharged via the path 7 together with the exhaust gas, so that only a reduced amount of the exhaust gas passes through the pattern 3 and the window 2, and deposits around the pattern 3. Thus, the pattern 3 is substantially free from deformations caused by such reaction products, which can maintain the original quality of the pattern 3.

(3) Even if the reaction products might re-stick onto the surface of the object areas 11, they can be removed by the reactive medium supplied via the path 7 and can be discharged with the exhaust gas. Thus, it is possible to accelerate the etching operation.

(4) The absorber film 62 is deposited or formed by an epitaxial process on the absorber film 61, or the absorber film 6 is etched so as to form the path 7. The path 7 has the depth D, and separates the pattern 3 from the object 10 when the stencil mask 1 is in intimate contact with the object 10. Therefore, no aluminum spacer is necessary. The depth D of the path 7 can be smaller than the minimum thickness which can be attained by the semiconductor manufacturing technique, and can remain uniform and unchangeable. In other words, the presence of this minute space can reduce unnecessary diffraction of the photons between the object 10 and the pattern 3. This assures the precise pattern 3. Further, the uniform depth D of the path 7 is effective to assure uniform radiation intensity of the photons in the respective photochemical reaction processes, which means that the pattern 3 can be more uniformly depicted.

(5) The space for separating the object 10 and the pattern 3 is secured on the stencil mask 1 itself and no aluminum spacer is necessary. Thus, the object 10 and the stencil mask 1 are accurately matched by only one positioning operation. This means that the object can be processed accurately and efficiently.

Embodiment 2:

The second embodiment relates to the stencil mask having a modified path 7, and differs from the first embodiment in this respect.

Figure 5:
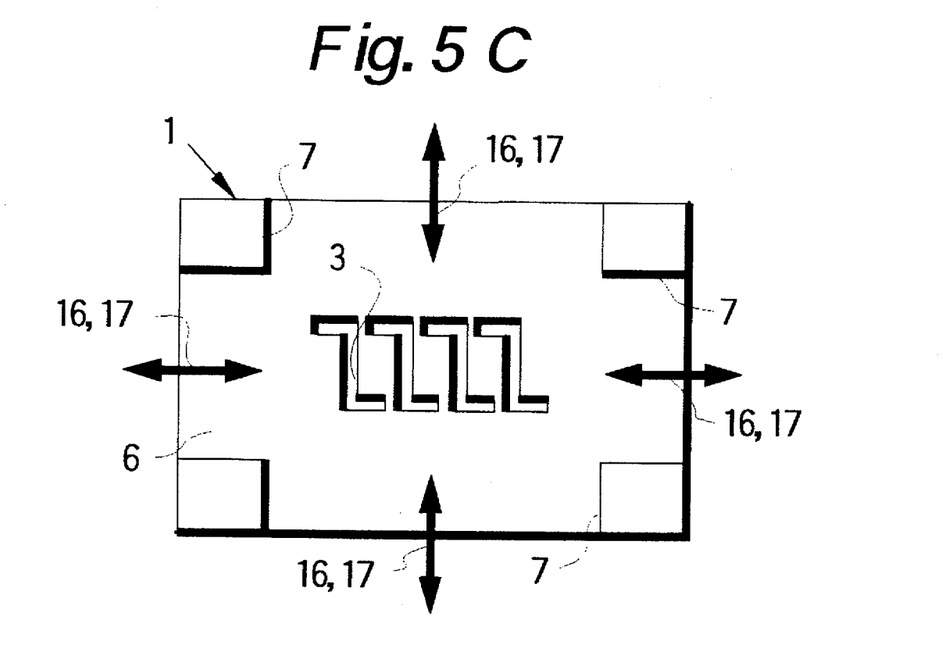
Figure 5A:
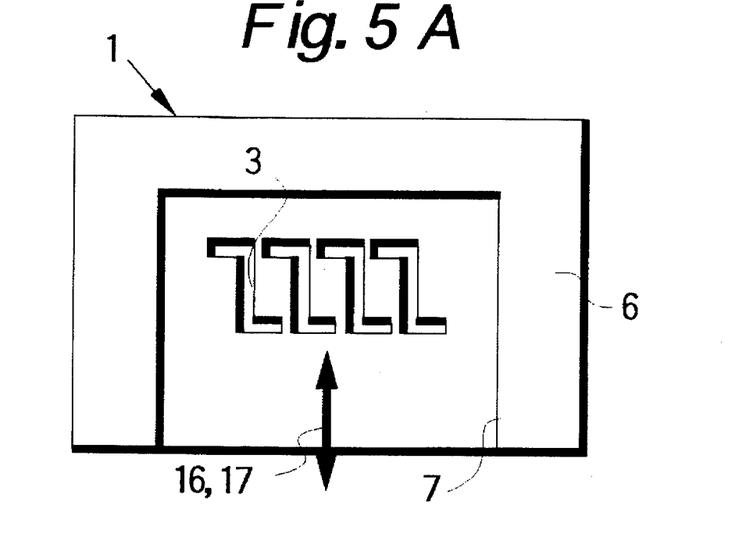

Referring to FIG. 5A, the path 7 is present over the pattern 3, and communicates with one side edge of the absorber film 6 (the lower part in FIG. 5A) of the stencil mask 1. The pattern 3 is at the center of the absorber film 6. The reactive gas and exhaust gas flow in the directions shown by arrows through the path 7.

Figure 5B:
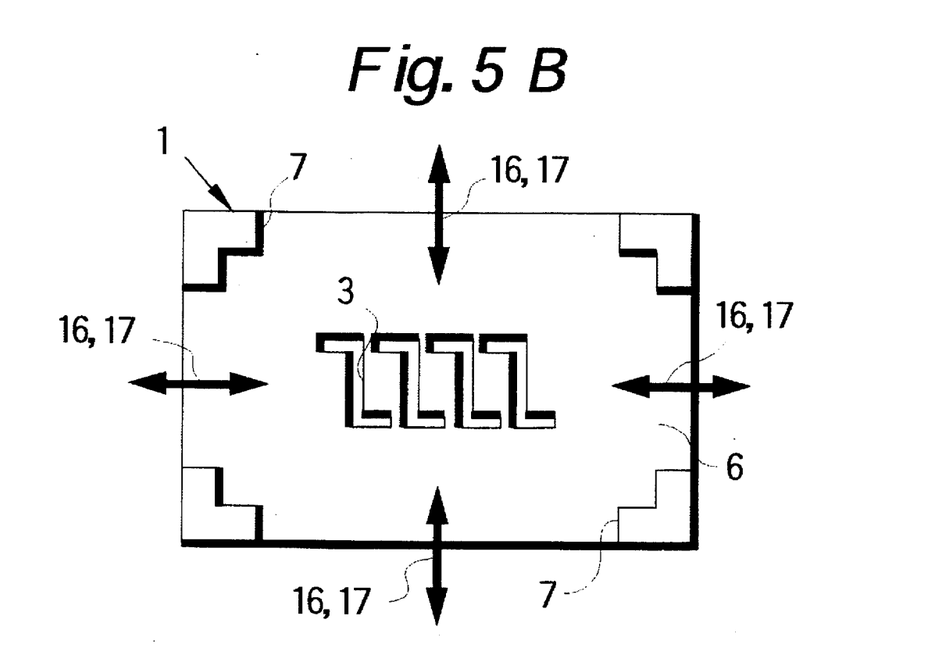

With the stencil mask 1 shown in FIG. 5B, the path 7 includes four portions, which extend over the pattern 3 and communicate with four side edges of the absorber film 6 (i.e. the upper, lower, left and right side edges of the stencil shown in FIG. 5B). The reactive gas 17 and the exhaust gas 16 flow in directions shown by arrows through the path 7.

The stencil mask 1 shown in FIG. 5C includes the path 7 similar to the stencil mask 1 shown in FIG. 5B. The path 7 in FIG. 5C has a shape somewhat different from those of FIG. 5B.

Referring to FIG. 5D, the path 7 includes four portions, which are present over the pattern 3, communicating with four corners of the absorber film 6 of the stencil mask 1, and extending diagonally on the absorber film 6.

Figure 6:
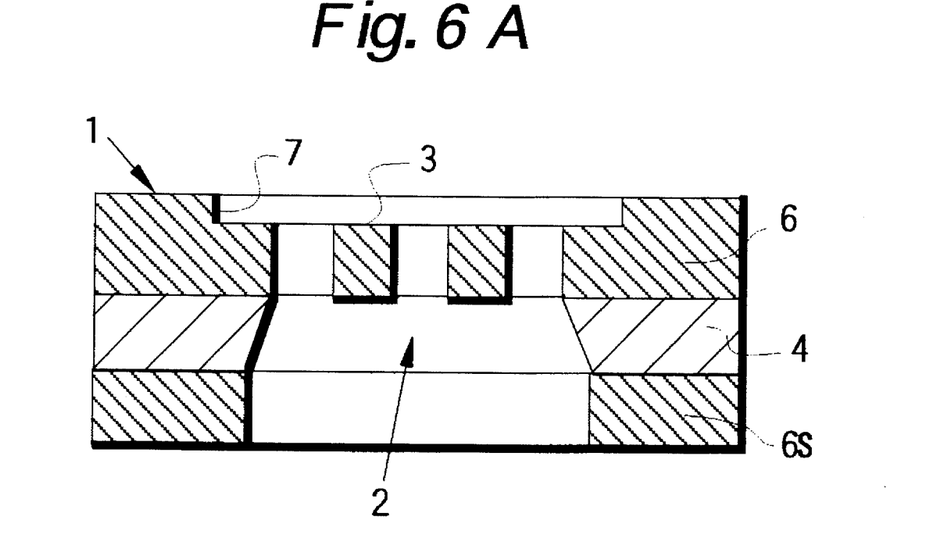
FIG. 6A and FIG. 6B are cross-sectional views showing a stencil mask according to a third embodiment of the invention.

Embodiment 3:

In this embodiment, the stencil mask 1 has a cross section which differs from those of the first and second embodiments.

The stencil mask 1 of FIG. 6A does not include the intermediate films 5 and 5S (or the intermediate film 5 or 5S). In the former case, the mask substrate 4 or the absorber film 6 also function as the intermediate film 5. In the latter case, the mask substrate 4 or the rear reinforcement film 6S also serves as the intermediate film 5S. This means that the stencil mask 1 has a simplified structure and can be manufactured in a simplified process.

Referring to FIG. 6B, the stencil mask 1 comprises the mask substrate 1, support films 51, 51S, absorber film 63, pattern 3 and window 2. The absorber film 63 covers exposed regions of the mask substrate 4 and support films 51, 51S. The support films 51, 51S are made of materials such as those of the absorber film 6 and rear reinforcement film 6S.

The absorber film 63 is formed after the mask substrate 4 is covered on the front surface thereof with the support film 51 and the pattern 3, and on the rear surface thereof with the support film 51S having an opening, and the window 2 is made.

Figure 7A:
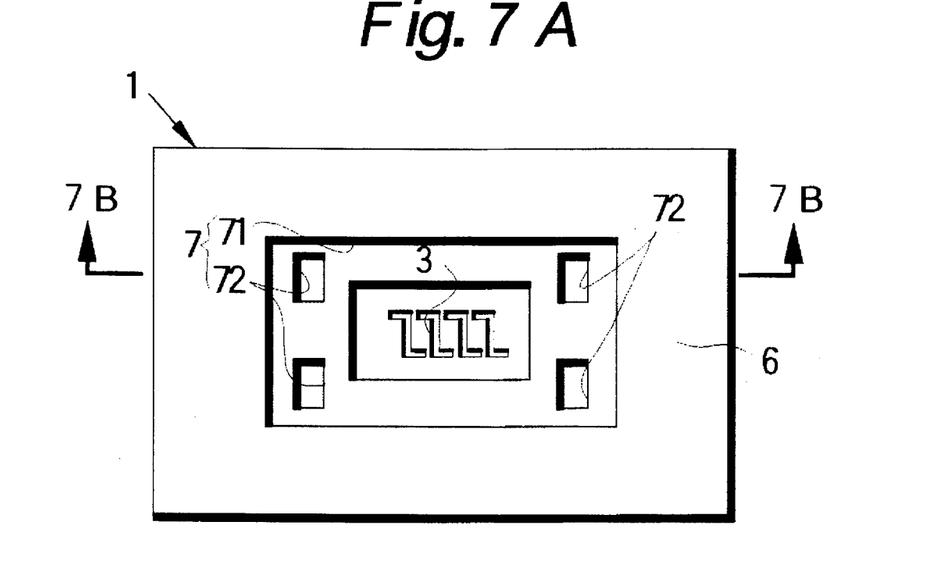
FIG. 7A is a top view of a stencil mask according to a fourth embodiment of the invention.
Figure 7B:
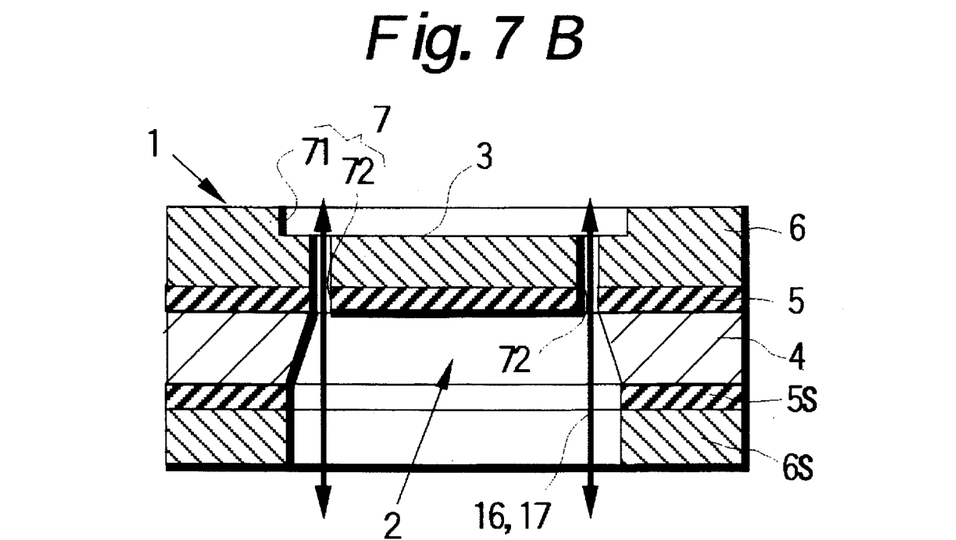
FIG. 7B is a cross-sectional view of the stencil mask of FIG. 7A, taken along the line 7B—7B of FIG. 7A.

Embodiment 4:

In this embodiment, the stencil mask 1 differs from those of the first to third embodiments in the structure of the path 7.

Referring to FIGS. 7A and 7B, the path 7 includes one portion 71 and four portions 72. The portion 71 is present in the absorber film 6, and portions 72 extend between the pattern 3 and the rear surface of the stencil mask 1 via the absorber film 6, intermediate film 5, mask substrate 4, intermediate film 5S and rear reinforcement film 6S. The portion 71 communicates with the portions 72. Specifically, the portions 72 are formed around the window 2 or the pattern 3, and are integral with the window 2. The portions 72 can be made by the process for making the window 2. The reactive gas 17 and exhaust gas 16 flow vertically across the stencil mask 1 through the portions 72. The stencil mask 1 of this embodiment is as effective as those of the first to third embodiments. Alternatively, the portions 72 may be independent from the window 2.

The invention has been described with reference to certain preferred embodiments thereof. It will be understood, however, that modifications and variations are possible within the scope of the appended claims.

For example, the present invention is applicable not only to the stencil mask used for the photochemical reaction process but also to stencil masks for objects which are processed by ions, electrons, charged particles and so on as photons.

Further, the present invention is also applicable to stencil masks for object which are directly processed by photons, i.e. stencil masks for photolithography in which a photoresist is directly exposed.

The stencil mask may be not only rectangular but also circular, oval and polygonal.

According to the present invention, it is possible to make the stencil mask precisely and efficiently with a reduced number of positioning operations. Further, it is possible to maintain a uniform space between the pattern of the stencil mask and an object to be processed.

What is claimed is:

1. A stencil mask for use with a photochemical reaction process, comprising:
   a) a mask substrate having a front surface, a rear surface and a plurality of side surfaces, and a window, the window extending from the front surface to the rear surface of the mask substrate;
   b) an absorber film absorbing or reflecting photons, the absorber film being formed on the front surface of the mask substrate over at least a region corresponding to the window;
   c) a pattern depicted on the absorber film over the region corresponding to the window; and
   d) a path supplying a reactive medium and discharging an exhaust medium containing reaction products, the path extending from the pattern to at least one of the side surfaces of the mask substrate.

2. The stencil mask of claim 1, wherein the absorber film includes a front surface and the path is formed on the front surface of the absorber film and extends from the pattern to at least one of the side surfaces of the mask substrate.

3. The stencil mask of claim 2, wherein the path includes a plurality of portions extending from the pattern to at least one of the side surfaces of the mask substrate.

4. The stencil mask of claim 2, wherein the path comprises a plurality of grooves formed on the front surface of the absorber film.

5. The stencil mask of claim 4, wherein a thin film is formed by a deposition process or an epitaxial process on the front surface of the absorber film over a region where the pattern and the at least one of the side surfaces of the mask substrate communicate, and the path is defined by the front surface of the absorber film and the thin film.

6. The stencil mask of claim 5, wherein the thin film has a thickness of less than sub-microns.

7. The stencil mask of claim 4, wherein the path is formed in the region where the pattern and the at least one of the side surfaces of the mask substrate communicate by etching.

8. The stencil mask of claim 1, wherein the path is further formed on the mask substrate and extends from the pattern to the rear surface of the mask substrate.

9. The stencil mask of claim 8, wherein the path is formed to surround at least one of the window and the pattern.

10. The stencil mask of claim 1, wherein the mask substrate includes a rear reinforcement film on the rear surface thereof to offset internal stress in the absorber film.

11. The stencil mask of claim 10, wherein the rear reinforcement film comprises a material which is resistant to gas or photons used in the photochemical reaction process.

12. The stencil mask of claim 1, wherein an intermediate film is positioned between the front surface of the mask substrate and the absorber film, the intermediate film having an adhesion to the mask substrate exceeding an adhesion between the mask substrate and the absorber film, the intermediate film further having an adhesion to the absorber film exceeding the adhesion between the mask substrate and the absorber film.

13. The stencil mask of claim 12, wherein the mask substrate includes a rear reinforcement film on the rear surface thereof to offset internal stress in the absorber film.

14. The stencil mask of claim 12, wherein the intermediate film compromises a material which is resistant to gas or photons used in the photochemical reaction process.

15. The stencil mask of claim 14, wherein the intermediate film comprises at least one of chromium (Cr), nickel (Ni), and titanium (Ti).

16. The stencil mask of claim 1, wherein the mask substrate comprises a material which is resistant to gas or photons used in the photochemical reaction process, and resistant to corrosion by a halogen-based gas used in the photochemical reaction process.

17. The stencil mask of claim 16, wherein the mask substrate comprises at least one of silicon (Si), gallium arsenide (CaAs), aluminum (Al) and a nickel (Ni) alloy.

18. The stencil mask of claim 1, wherein the absorber film comprises a material which is resistant to gas or photons used in the photochemical reaction process.

19. The stencil mask of claim 14, wherein the absorber film comprises at least one of gold (Au), tungsten (W), tantalum (Ta), tungsten oxide, tantalum oxide, tungsten nitride, tantalum nitride, tungsten carbide, tantalum carbide, tungsten boronide, and tantalum boronide.

20. A stencil mask for use with a photochemical reaction process, comprising:
   a) a mask substrate having a front surface, a rear surface, a plurality of side surfaces, and a window, the window extending from the front surface to the rear surface of the mask substrate;
   b) an absorber film absorbing or reflecting photons, the absorber film being formed on the front surface of the mask substrate over at least a region corresponding to the window;

c) a pattern depicted on the absorber film over the region corresponding to the window; and d) a path supplying a reactive medium and discharging an exhaust medium containing reaction products, the path including a portion independent of the pattern and the window.

21. The stencil mask of claim 20, wherein the path is further formed on the mask substrate and extends from the pattern to the rear surface of the mask substrate.

22. The stencil mask of claim 21, wherein the path is formed to surround at least one of the window and the pattern.

23. A stencil mask for use with a photochemical reaction process on a semiconductor substrate, comprising:

a) a mask substrate having a front surface, a rear surface, a plurality of side surfaces, and a window, the window extending from the front surface to the rear surface of the mask substrate;

b) an absorber film absorbing or reflecting photons, the absorber film being formed on the front surface of the mask substrate over at least a region corresponding to the window;

c) a pattern depicted on the absorber film over the region corresponding to the window; and d) a path supplying a reactive medium and discharging an exhaust medium containing reaction products, wherein when the stencil mask is in intimate contact with the semiconductor substrate for processing, the path includes a space between the semiconductor substrate and at least one of the absorber film and the mask substrate.

24. The stencil mask of claim 23, wherein the space allows free movement of the reactive medium to the semiconductor substrate and the exhaust medium containing reaction products from the semiconductor substrate.

25. The stencil mask of claim 23, wherein the path is further formed on the mask substrate and extends from the pattern to the rear surface of the mask substrate.

26. The stencil mask of claim 25, wherein the path is formed to surround at least one of the window and the pattern.

27. A method of making a stencil mask for use in a photochemical reaction process, the method comprising:

forming an absorber film on the front surface of a mask substrate, the mask substrate having a front surface, a rear surface and a plurality of side surfaces;

forming a pattern in the absorber film over a region;

forming a plurality of grooves on the absorber film extending from the pattern to a plurality of the side surfaces of the mask substrate; and etching the rear surface of the mask substrate in an area corresponding to the region of the pattern to form a window through which beams may pass to the pattern, wherein the plurality of grooves provide a path for supplying a reactive medium and discharging an exhaust medium containing reaction products.

28. A method of processing a semiconductor substrate through a photochemical reaction process, the semiconductor substrate having a first surface, the method comprising:

overlaying a stencil mask onto the first surface of the semiconductor substrate, the stencil mask including:

a mask substrate with a front surface, a rear surface and a plurality of side surfaces;

an absorber film formed on the front surface of the mask substrate, the absorber film having a front surface, a pattern formed thereon over a region, and grooves extending from the pattern to at least one of the side surfaces of the mask substrate to form a path; and a window extending from the rear surface of the mask substrate to the mask pattern in an area corresponding to the region of the pattern; irradiating the semiconductor substrate with photons through the window and the pattern;

supplying a reactive medium through the path to a portion the first surface of the semiconductor substrate corresponding to the region of the pattern; and discharging an exhaust medium through the path from the portion of the first surface of the semiconductor substrate corresponding to the region of the pattern.

* * * * *